(12) United States Patent
Lee

(10) Patent No.: US 10,923,499 B2
(45) Date of Patent: Feb. 16, 2021

(54) SEMICONDUCTOR DEVICE AND MANUFACTURING METHOD OF THE SAME

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/812,626

(22) Filed: Mar. 9, 2020

(65) Prior Publication Data

US 2020/0212064 A1 Jul. 2, 2020

Related U.S. Application Data

(63) Continuation of application No. 16/384,764, filed on Apr. 15, 2019, now Pat. No. 10,629,617.

(30) Foreign Application Priority Data

Sep. 18, 2018 (KR) .......................... 10-2018-0111800

(51) Int. Cl.
*H01L 21/822* (2006.01)
*H01L 27/11582* (2017.01)
*H01L 29/10* (2006.01)

(52) U.S. Cl.
CPC .... *H01L 27/11582* (2013.01); *H01L 29/1037* (2013.01)

(58) Field of Classification Search
CPC .................................................. H01L 21/8221
See application file for complete search history.

(56) References Cited

U.S. PATENT DOCUMENTS

| 9,520,485 B2 | 12/2016 | Lue |
| 2013/0228850 A1 | 9/2013 | Tanaka et al. |
| 2015/0179660 A1 | 6/2015 | Yada et al. |
| 2017/0207232 A1 | 7/2017 | You et al. |
| 2018/0331117 A1* | 11/2018 | Titus .................. H01L 27/11575 |

FOREIGN PATENT DOCUMENTS

| KR | 1020120026881 A | 3/2012 |
| KR | 1020170086746 A | 7/2017 |

* cited by examiner

*Primary Examiner* — Peniel M Gumedzoe
*Assistant Examiner* — Christopher A Johnson
(74) *Attorney, Agent, or Firm* — William Park & Associates Ltd.

(57) ABSTRACT

The present disclosure relates to a semiconductor device having improved structural stability and a method of manufacturing such a semiconductor device. The semiconductor device includes a first stacked structure and a second stacked structure. The semiconductor device further includes a first support including a first upper pillar passing through the second stacked structure and including at least two first lower pillars extending from the first upper pillar and passing through the first stacked structure.

7 Claims, 18 Drawing Sheets

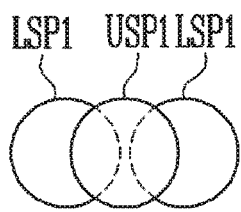
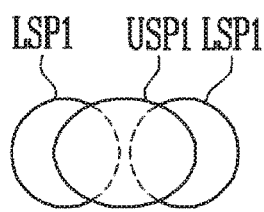
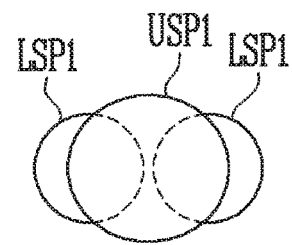
FIG. 5A          FIG. 5B          FIG. 5C
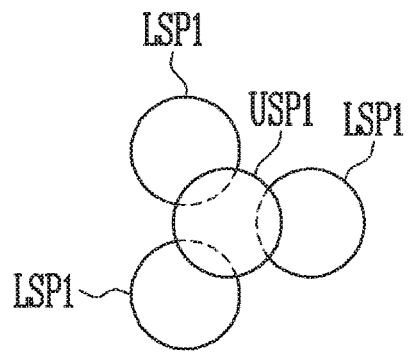
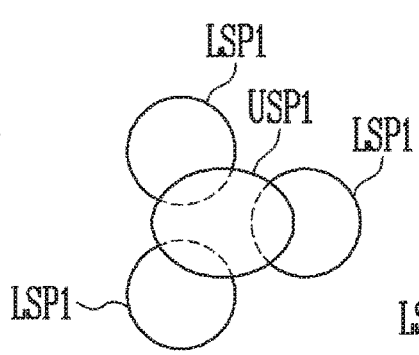
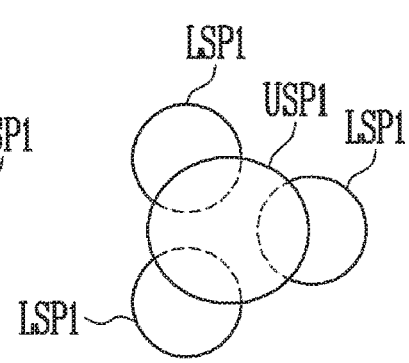
FIG. 5D          FIG. 5E          FIG. 5F
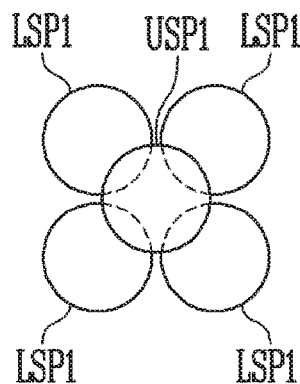
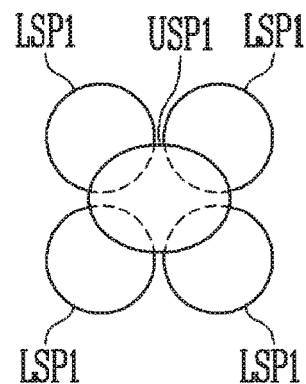
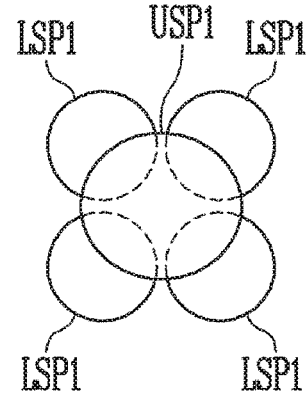
FIG. 5G          FIG. 5H          FIG. 5I

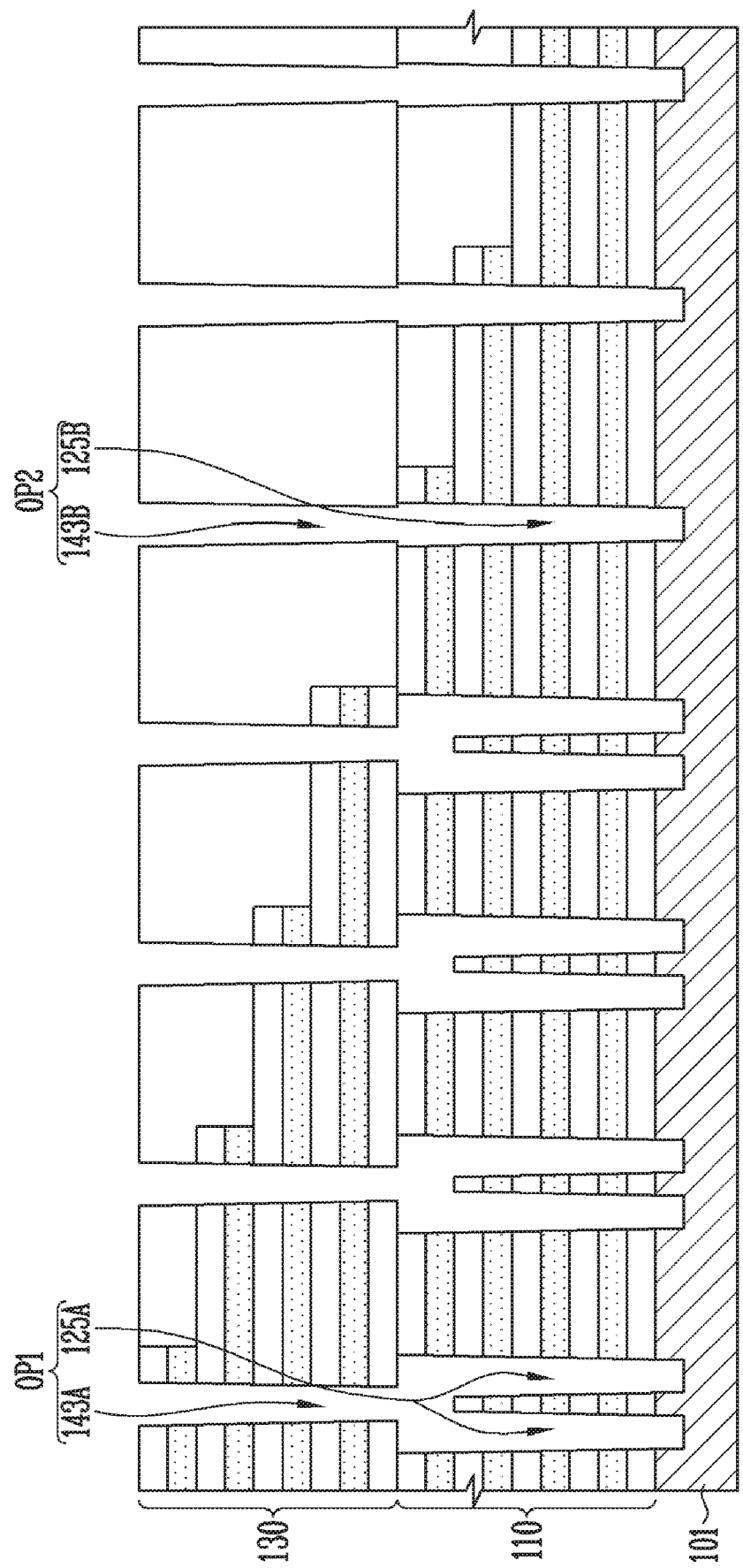

SEMICONDUCTOR DEVICE AND MANUFACTURING METHOD OF THE SAME

CROSS-REFERENCE TO RELATED APPLICATION

The present application is a continuation application of U.S. patent application Ser. No. 16/384,764, filed on Apr. 15, 2019, and claims priority under 35 U.S.C. § 119(a) to Korean patent application number 10-2018-0111800, filed on Sep. 18, 2018, in the Korean Intellectual Property Office, the entire disclosure of which is incorporated herein by reference.

BACKGROUND

1. Technical Field

Various embodiments relate generally to a semiconductor device and a manufacturing method thereof, and more particularly, to a three-dimensional semiconductor memory device and a manufacturing method thereof.

2. Related Art

Semiconductor memory devices may include memory cells storing data. To improve the integration density of memory cells, three-dimensional semiconductor memory devices have been proposed.

The integration density of memory cells of three-dimensional semiconductor memory devices may be improved by increasing the number of memory cells stacked on top of each other. However, when the number of stacked memory cells increases, it may be difficult to obtain structural stability of semiconductor memory devices.

SUMMARY

According to an embodiment, a semiconductor device may include a first stacked structure including first interlayer insulating layers and first conductive patterns stacked alternately with each other. The semiconductor device may also include a second stacked structure including second interlayer insulating layers and second conductive patterns stacked alternately with each other over the first stacked structure. The semiconductor device may further include a first support including a first upper pillar passing through the second stacked structure and including at least two first lower pillars extending from the first upper pillar and passing through the first stacked structure.

According to an embodiment, a method of manufacturing a semiconductor device may include forming a first stacked structure, forming first sacrificial pillars and second sacrificial pillars passing through the first stacked structure, and forming a second stacked structure on the first stacked structure, the second stacked structure extending to cover the first sacrificial pillars and exposing the second sacrificial pillars. The method may also include forming first upper holes passing through the second stacked structure, the first upper holes each overlapping at least two of the first sacrificial pillars, removing the first sacrificial pillars through the first upper holes to open first lower holes, and forming first supports in the first upper holes and the first lower holes.

BRIEF DESCRIPTION OF THE DRAWINGS

FIGS. 5A to 5I are diagrams illustrating various modifications of first upper and lower pillars of a first support, according to an embodiment of the present disclosure.

FIGS. 8A to 8F and FIGS. 9A and 9B are diagrams sequentially illustrating a method of manufacturing a semiconductor device, according to an embodiment of the present disclosure.

DETAILED DESCRIPTION

Hereinafter, various example embodiments are described in detail with reference to the accompanying drawings. The drawings are provided to allow those with ordinary skill in the art to understand the scope of the embodiments of the teachings. The present teachings may, however, be embodied in different forms and should not be construed as being limited to the embodiments set forth herein. Rather, these embodiments are provided so that this disclosure will be enabling. In addition, the embodiments are provided to convey aspects of the present teachings to those skilled in the art.

While terms such as "first" and "second" may be used to describe various components, such components must not be understood as being limited to the above terms. The above terminologies are used to distinguish one component from the other component, for example, a first component may be referred to as a second component without departing from a scope according to the concept of the present disclosure and similarly, a second component may be referred to as a first component.

It will be understood that when an element is referred to as being "connected" or "coupled" to another element, it can be directly connected or coupled to the other element, or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

Terms used in the present application are used to describe particular embodiments and are not intended to limit the present disclosure. Singular forms in the present disclosure are intended to include the plural forms as well, unless the context clearly indicates otherwise. In the present specification, the terms "include" and "have" indicate that a feature, a number, a step, an operation, a component, a part or the combination those of described in the specification is present, but do not exclude a possibility of the presence of one or more additional features, numbers, steps, operations, components, parts, or combinations thereof.

Hereinafter, example embodiments are described with reference to the accompanying drawings.

Various embodiments of the present disclosure provide a semiconductor device having improved structural stability and a manufacturing method thereof.

Figure 1A:
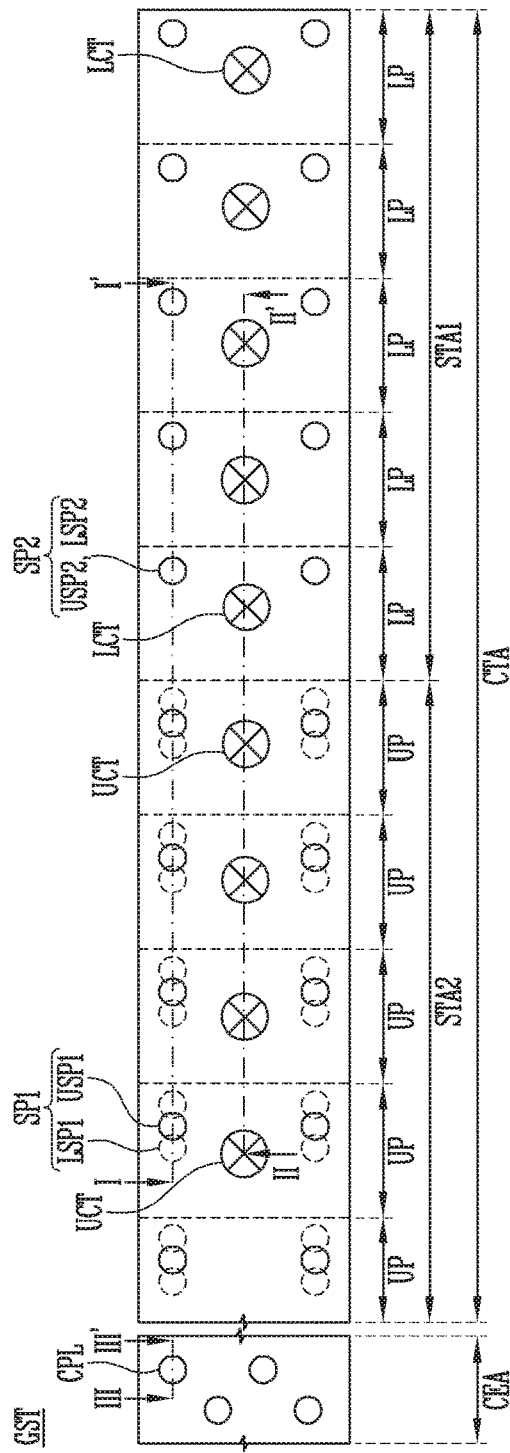
FIGS. 1A to 1C are plan views illustrating semiconductor devices, according to embodiments of the present disclosure.
Figure 1B:
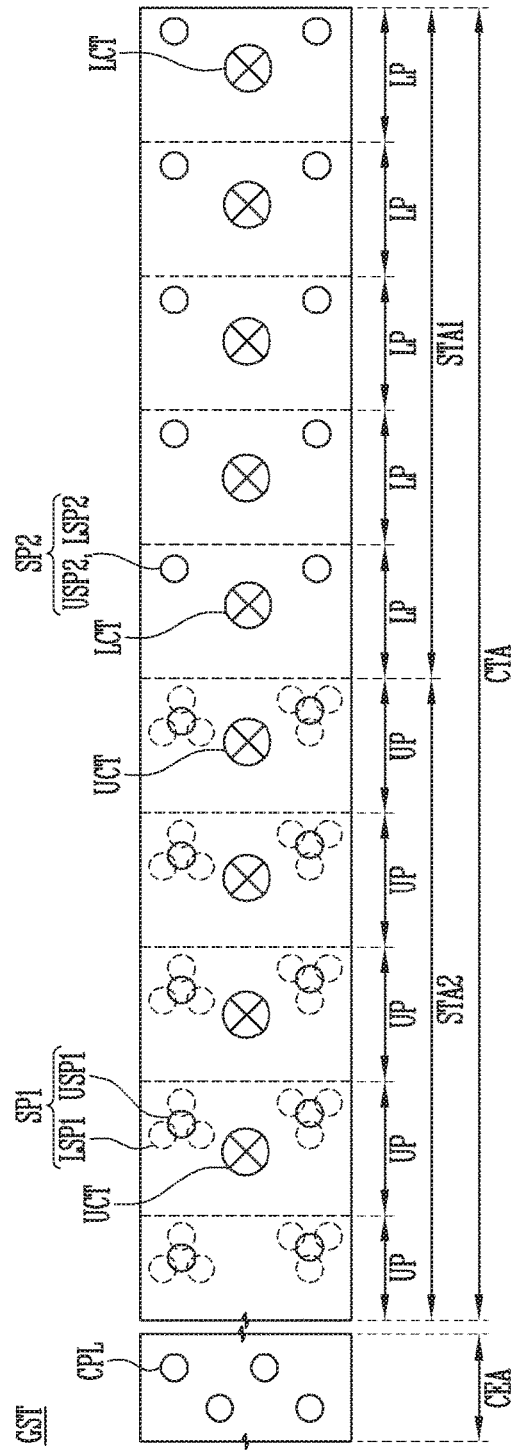
Figure 1C:
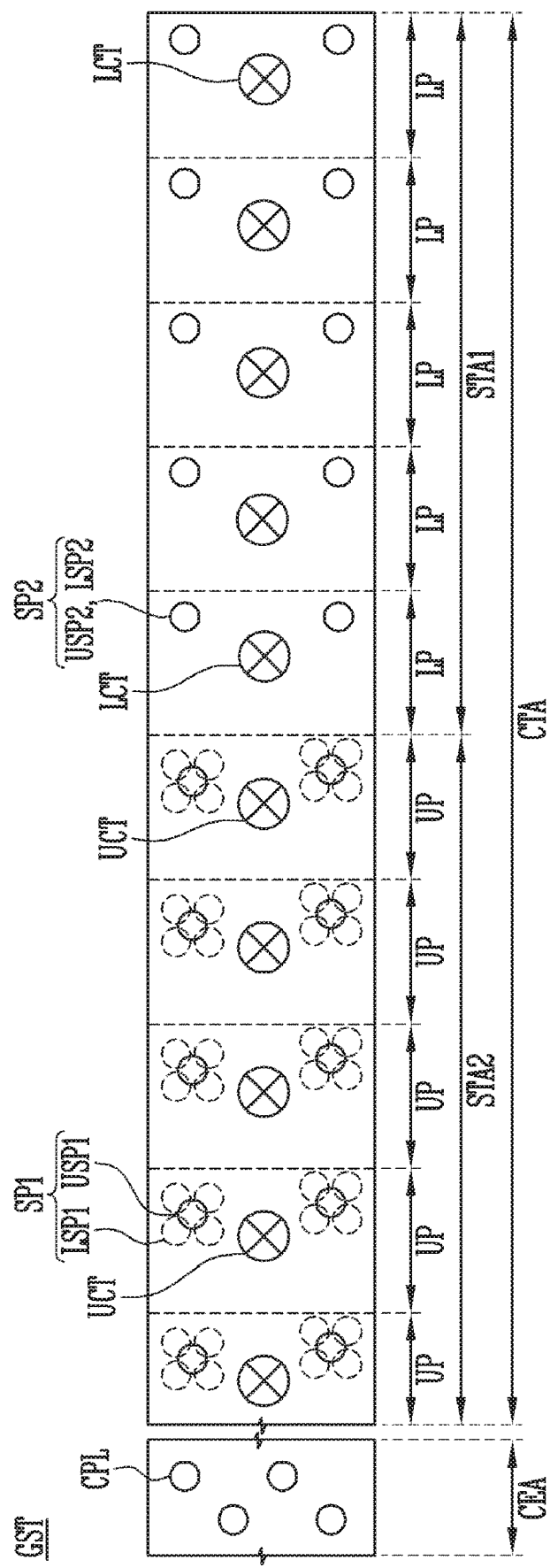

FIGS. 1A to 1C are plan views illustrating semiconductor devices, according to embodiments of the present disclosure.

Figure 2A:
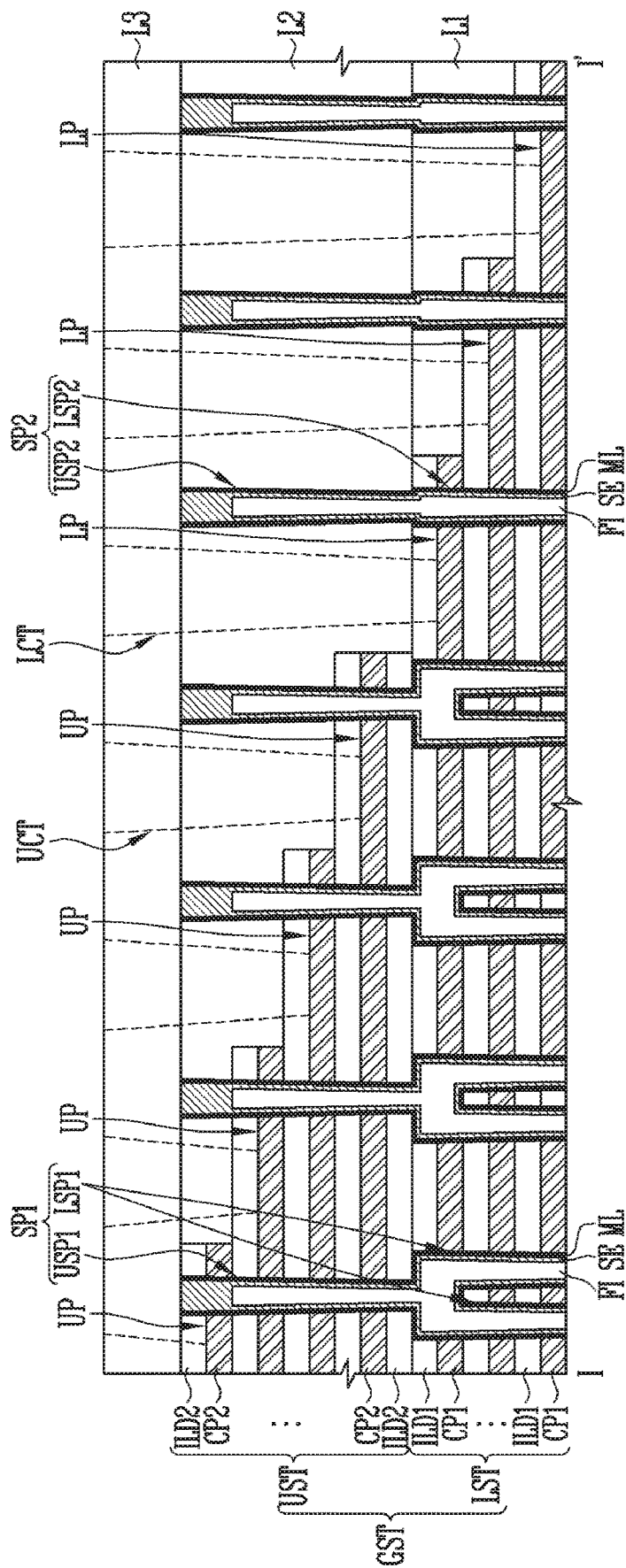
FIGS. 2A to 2C are cross-sectional views illustrating a semiconductor device, according to an embodiment of the present disclosure.
Figure 2B:
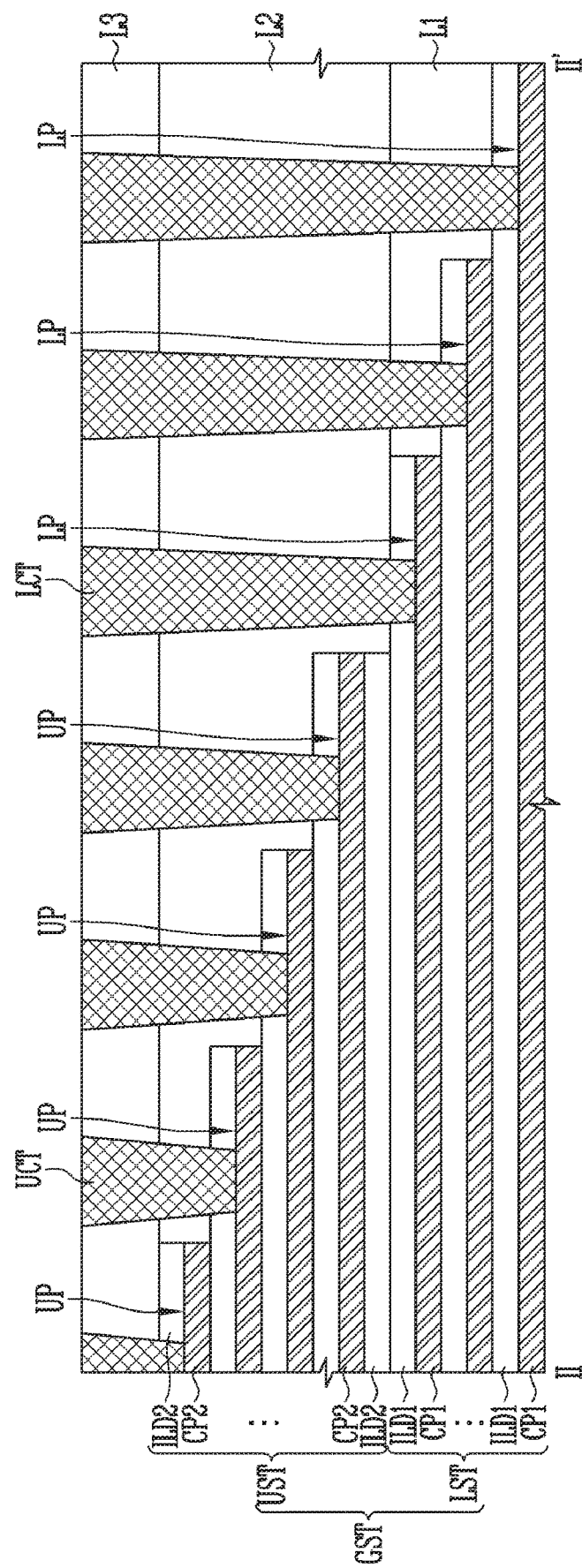
Figure 2C:
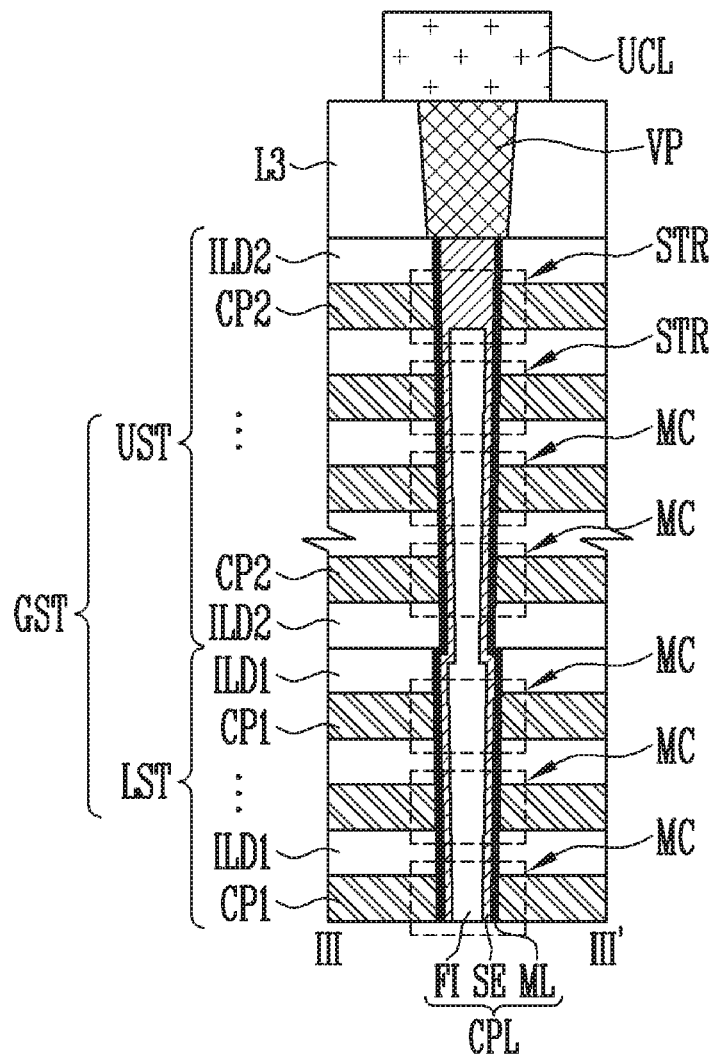

Referring to FIGS. 1A to 1C, a semiconductor device may include a gate stacked structure GST including interlayer insulating layers and conductive patterns stacked alternately with each other. The interlayer insulating layers are denoted by ILD1 and ILD2, as shown in FIGS. 2A to 2C. The conductive patterns are denoted by CP1 and CP2, as shown in FIGS. 2A to 2C. The conductive patterns of the gate stacked structure GST may include word lines and select lines. The word lines may be coupled to the gates of memory cells and select lines may be coupled to the gates of select transistors. The stacked structure of the conductive patterns and the interlayer insulating layers is described in detail below with reference to FIGS. 2A to 2C.

The gate stacked structure GST may include a cell array region CEA and a contact region CTA. FIGS. 1A to 1C do not show a connected part between the cell array region CEA and the contact region CTA to schematize a portion of the cell array region CEA and a portion of the contact region CTA. However, the contact region CTA may extend from the cell array region CEA.

The cell array region CEA of the gate stacked structure GST may be penetrated by cell plugs CPL. Each of the cell plugs CPL may form a cell string. The cell plugs CPL may be arranged in a zigzag pattern or a matrix format in the cell array region CEA. The number and arrangement of cell plugs CPL in the cell array region CEA is not limited to the example shown in FIGS. 1A to 1C and may differ for different embodiments.

The contact region CTA of the gate stacked structure GST may include a plurality of pad portions UP and LP covered by insulating layers L1, L2, and L3 as shown in FIGS. 2A and 2B. The pad portions UP and LP shown in FIGS. 1A to 1C may be parts of the conductive patterns extending in the cell array region CEA. The pad portions UP and LP may be patterned stepwise. The pad portions UP and LP may include lower pad portions LP forming a first stepped structure STA1 and upper pad portions UP forming a second stepped structure STA2. The first stepped structure STA1 might not be covered by the second stepped structure STA2 and may be exposed. In other words, the first stepped structure STA1 may extend laterally from the second stepped structure STA2.

The upper pad portions UP may contact first contact plugs UCT, respectively. The first contact plugs UCT may overlap the upper pad portions UP, respectively. The upper pad portions UP may be penetrated by first supports SP1. The first supports SP1 may be disposed adjacent to corners of the upper pad portions UP. The first supports SP1 may include a first upper pillar USP1 and two or more first lower pillars LSP1 overlapping the first upper pillar USP1. As used herein, the word "overlap," in addition to extending over, can mean to extend under when lower pillars are under upper pillars. For example, as shown in FIG. 1A, two different first lower pillars LSP1 may overlap one first upper pillar USP1.

In another example, as shown in FIG. 1B, three different first lower pillars LSP1 may overlap one first upper pillar USP1. In another example, as shown in FIG. 1C, four different first lower pillars LSP1 may overlap one first upper pillar USP1. The overlapping structure between the first upper pillar USP1 and the first lower pillar LSP1, which constitute each of the first supports SP1, is not limited to the example as shown in FIGS. 1A to 1C and may be changed to various other structures. As described above, the first upper pillars USP1 of the first supports SP1 may be disposed adjacent to the corners of the upper pad portions UP.

Referring to FIGS. 1A to 1C, the lower pad portions LP may be coupled to second contact plugs LCT, respectively. The second contact plugs LCT may overlap the lower pad portions LP, respectively. The lower pad portions LP may be penetrated by second supports SP2. The second supports SP2 may be disposed adjacent to corners of the lower pad portions LP. The second supports SP2 may include a second upper pillar USP2 and at least one second lower pillar LSP2 overlapping the second upper pillar USP2. Although FIGS. 1A to 1C show an example in which a central axis of the second lower pillar LSP2 and a central axis of the second upper pillar USP2 coincide with each other, the present teachings are not limited to such concentric alignment. Various modifications of the overlapping structure between the second upper pillar USP2 and the second lower pillar LSP2 are described below with reference to FIGS. 7A to 7F.

FIGS. 2A to 2C are cross-sectional views illustrating a semiconductor device according to embodiments of the present disclosure. More specifically, FIG. 2A is a cross-sectional diagram of a semiconductor device taken along line I-I' of FIG. 1A, FIG. 2B is a cross-sectional diagram of a semiconductor device taken along line II-II' of FIG. 1A, and FIG. 2C is a cross-sectional diagram illustrating a semiconductor device taken along line III-III' of FIG. 1A. FIGS. 2A to 2C show an upper part of the gate stacked structure GST and an upper part of a cell string, whereas a lower part of the gate stacked structure GST and a lower part of the cell string are not depicted in FIGS. 2A to 2C.

Referring to FIGS. 2A to 2C, the gate stacked structure GST may include a first stacked structure LST (e.g., a lower stacked structure) and a second stacked structure UST (e.g., an upper stacked structure) stacked over the first stacked structure LST. The first stacked structure LST may include alternately stacked first interlayer insulating layers ILD1 and first conductive patterns CP1. The second stacked structure UST may include alternately stacked second interlayer insulating layers ILD2 and second conductive patterns CP2. The first conductive patterns CP1 and the second conductive patterns CP2 may serve as gates of transistors. For example, the first conductive patterns CP1 may serve as word lines coupled to the gates of memory cells MC.

Some of the second conductive patterns CP2 may serve as word lines coupled to the gates of memory cells MC, and the other second conductive patterns CP2 may serve as select lines coupled to the gates of select transistors STR. The gate stacked structure GST may be covered by the first, second, and third insulating layers L1, L2, and L3.

Referring to FIGS. 2A and 2B, the first conductive patterns CP1 of the first stacked structure LST may include the lower pad portions LP stacked in a first stepped structure, and the second conductive patterns CP2 of the second stacked structure UST may include the upper pad portions UP stacked in a second stepped structure.

The first insulating layer L1 may cover the first stepped structure of the first stacked structure LST, and the surface thereof may be planarized. The second insulating layer L2 may be disposed on the first insulating layer L1 and cover the second stepped structure of the second stacked structure UST. The surface of the second insulating layer L2 may be planarized.

Referring to FIG. 2A, the first supports SP1 and the second supports SP2 may be arranged not to reach the first and second contact plugs UCT and LCT so as to ensure alignment margins of the first and second contact plugs UCT and LCT as indicated by dashed lines in FIG. 2A.

Each of the first supports SP1 may include a first upper pillar USP1 passing through the second stacked structure UST and at least two first lower pillars LSP1 extending from the first upper pillar USP1 to pass through the first stacked structure LST. The first upper pillar USP1 may pass through the upper pad portion UP corresponding thereto.

Each of the second supports SP2 may include at least one second lower pillar LSP2 passing through the first stacked structure LST and a second upper pillar USP2 extending from the second lower pillar LSP2 to pass through the second insulating layer L2. The second lower pillar LSP2 may pass through the lower pad portion LP corresponding thereto. When the first insulating layer L1 is arranged between the lower pad portion LP and the second upper pillar USP2, the second lower pillar LSP2 may pass through the first insulating layer L1.

In terms of manufacturing process characteristics of a semiconductor device according to an embodiment of the present disclosure, the first and second supports SP1 and SP2 may include the same material layers as those of the cell plugs CPL as shown in FIG. 2C. For example, each of the first and second supports SP1 and SP2 may include a gap-filling insulating layer FI, a semiconductor layer SE, and a memory layer ML. The gap-filling insulating layer FI may be arranged in a central area of each of the first and second supports SP1 and SP2 and include an insulating material. The semiconductor layer SE may extend along a surface of the gap-filling insulating layer FI and include silicon. An upper end of the semiconductor layer SE adjacent to the third insulating layer L3 may include doped silicon. The memory layer ML may extend along the surface of the semiconductor layer SE. The memory layer ML may be formed to open the upper end of the semiconductor layer SE. The first and second supports SP1 and SP2 may be completely covered by the third insulating layer L3. The semiconductor layer SE and the memory layer ML of each of the first and second supports SP1 and SP2 may be dummy layers which are not involved in operations of the semiconductor device.

Referring to FIG. 2B, the first contact plugs UCT may pass through at least one of the third insulating layer L3, the second insulating layer L2, and the second interlayer insulating layers ILD2 to contact the upper pad portions UP of the second conductive patterns CP2, respectively. The first contact plugs UCT may extend from the third insulating layer L3 toward the upper pad portions UP by different depths so as to contact the upper pad portions UP arranged at different heights.

The second contact plugs LCT may pass through at least one of the third insulating layer L3, the second insulating layer L2, the first insulating layer L1, and the first interlayer insulating layers ILD1 to contact the lower pad portions LP of the first conductive patterns CP1, respectively. The second contact plugs LCT may extend from the third insulating layer L3 to the lower pad portions LP by different depths so as to contact the lower pad portions LP arranged at different heights. The second contact plugs LCT may have a greater length and extend to a greater depth than the first contact plugs UCT.

Referring to FIG. 2C, the cell plug CPL may extend to pass through the first stacked structure LST and the second stacked structure UST. The cell plug CPL may include the gap-filling insulating layer FI, the semiconductor layer SE, and the memory layer ML as described above with reference to FIG. 2A. The gap-filling insulating layer FI may be disposed in a central area of each of the cell plugs CPL. The semiconductor layer SE of the cell plug CPL may couple the memory cells MC and the select transistors STR, which are arranged along the cell plug CPL, in series to define a cell string, and may serve as a channel layer of the cell string. The memory layer ML of the cell plug CPL may serve as a region where data is stored.

The semiconductor layer SE of the cell plug CPL may be electrically coupled to an upper conductive line UCL. The upper conductive line UCL may be a bit line or a common source line. The upper conductive line UCL may be coupled to the semiconductor layer SE of the cell plug CPL through a via plug VP passing through the third insulating layer L3. In another example, the upper conductive line UCL may pass through the third insulating layer L3 to directly contact the semiconductor layer SE of the cell plug CPL.

A voltage applied to the upper conductive line UCL may be applied to the semiconductor layer SE of the cell plug CPL by control of at least one select transistor STR disposed between the upper conductive line UCL and the memory cells MC. The memory layer ML of the cell plug CPL may store data which is changed by a voltage difference between each of the conductive patterns CP1 and CP2 coupled to the gates of the memory cells MC and the semiconductor layer SE of the cell plug CPL.

The structure described above with reference to FIGS. 2A to 2C may also be applicable to the semiconductor device shown in FIGS. 1B and 1C as well as the semiconductor device shown in FIG. 1A.

As shown in FIG. 2A, the first upper pillars USP1 may pass through the upper pad portions UP contacting the first contact plugs UCT. To ensure alignment margins of the first contact plugs UCT and the upper pad portions UP, the number of first upper pillars USP1 passing through the upper pad portions UP may be limited.

The first lower pillars LSP1 may pass through a portion of the first stacked structure LST overlapping the upper pad portions UP of the second stacked structure UST. According to embodiments of the present disclosure, a portion of the first stacked structure LST overlapping with the upper pad portions UP may be penetrated by the first lower pillars LSP1. The number of first lower pillars LSP1 may be greater than the number of first upper pillars USP1. Therefore, even when the number of first upper pillars USP1 is limited, a support force of each of the first supports SP1 may be reinforced by the first lower pillars LSP1. The first lower pillars LSP1 may alleviate stress caused by the second stacked structure UST.

Figure 3:
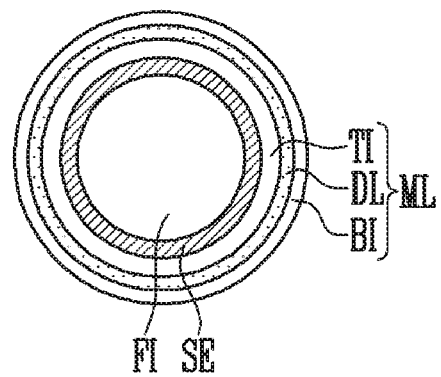
FIG. 3 is a diagram illustrating cross sections of a gap-filling insulating layer, a semiconductor layer, and a memory layer, according to an embodiment of the present disclosure.

FIG. 3 is a diagram illustrating cross sections of the gap-filling insulating layer FI, the semiconductor layer SE, and the memory layer ML, according to an embodiment of the present disclosure.

Referring to FIG. 3, the memory layer ML surrounding the gap-filling insulating layer FI with the semiconductor layer SE interposed therebetween may include a tunnel insulating layer TI, a data storage layer DL, and a blocking insulating layer BI. The tunnel insulating layer TI may surround an outer wall of the semiconductor layer SE, the data storage layer DL may surround an outer wall of the tunnel insulating layer TI, and the blocking insulating layer BI may surround an outer wall of the data storage layer DL.

The tunnel insulating layer TI may include a silicon oxide layer enabling charge tunneling. The data storage layer DL may include various materials, for example, a nitride layer capable of trapping charges. In addition, the data storage layer DL may include silicon, a phase change material, nanodots, and/or the like. The blocking insulating layer BI may include an oxide layer capable of blocking charges.

Figure 4A:
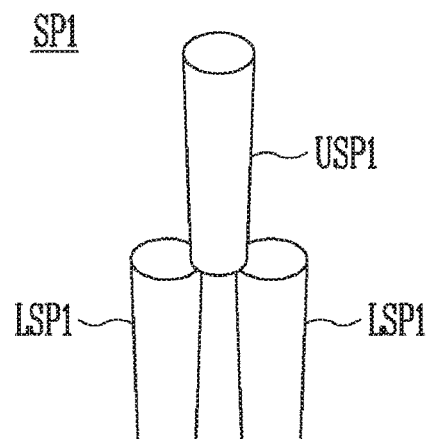
FIGS. 4A to 4C are perspective views illustrating first supports shown in FIGS. 1A to 1C.
Figure 4B:
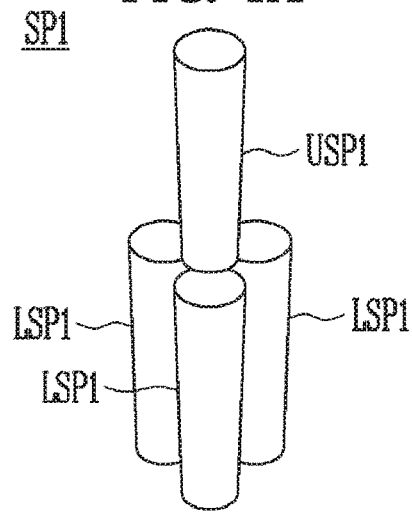
Figure 4C:
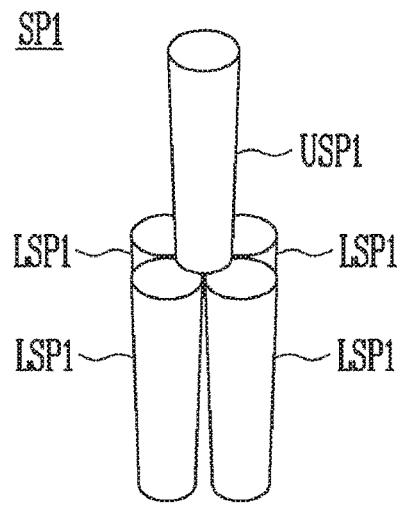

FIGS. 4A to 4C are perspective views illustrating first supports SP1 shown in FIGS. 1A to 1C.

Referring to FIGS. 4A to 4C, the first upper pillar USP1 forming each of the first supports SP1 may commonly overlap the first lower pillars LSP1. The number of first lower pillars LSP1 may be greater than the number of first upper pillars USP1. In other words, each of the first supports SP1 may include a first upper pillar USP1 and first lower pillars LSP1 extending from the first upper pillar USP1.

According to embodiments of the present disclosure, because each of the first supports SP1 includes two or more first lower pillars LSP1 extending from one first upper pillar USP1, a support force of each of the first supports SP1 may be reinforced.

By forming the first upper pillar USP1 and the first lower pillars LSP1 forming each of the first supports SP1 by using the same material layers as those of the cell plugs CPL as shown in FIGS. 2A and 2C, the first supports SP1 may be formed using the processes of forming the cell plug CPL. In another example, the first upper pillar USP1 and the first lower pillars LSP1 integrally formed with each other and constituting each of the first supports SP1 may include an insulating layer.

FIGS. 5A to 5I are diagrams illustrating various variations of the first upper pillar USP1 and the first lower pillars LSP1 of the first support SP1, according to different embodiments of the present disclosure.

Referring to FIGS. 5A to 5I, the first support may be a connection structure of the first upper pillar USP1 and the first lower pillars LSP1. As described above, the number of first lower pillars LSP1 coupled to the first upper pillar USP1 may vary.

Each of the first lower pillars LSP1 and the first upper pillar USP1 may have the same cross-sectional shape and area for some embodiments, as shown in FIGS. 5A, 5D, and 5G.

In addition, each of the first lower pillars LSP1 and the first upper pillar USP1 may have different cross-sectional shapes and/or areas for other embodiments, as shown in FIGS. 5B, 5C, 5E, 5F, 5H, and 5I.

For example, as shown in FIGS. 5B, 5E, and 5H, the first upper pillar USP1 may have an elliptical cross section, and each of the first lower pillars LSP1 may have a circular cross section.

In another example, each of the first lower pillars LSP1 and the first upper pillar USP1 may have a circular cross section as shown in FIGS. 5C, 5F, and 5I, and the first upper pillar USP1 may have a greater cross-sectional area than each of the first lower pillars LSP1.

However, the cross-sectional shapes of the first upper pillar USP1 and each of the first lower pillars LSP1 are not limited to the above-described circular or elliptical shapes. For example, the first upper pillar USP1 and each of the first lower pillars LSP1 may have various polygonal shapes, such as a triangle or a square.

Figure 6A:
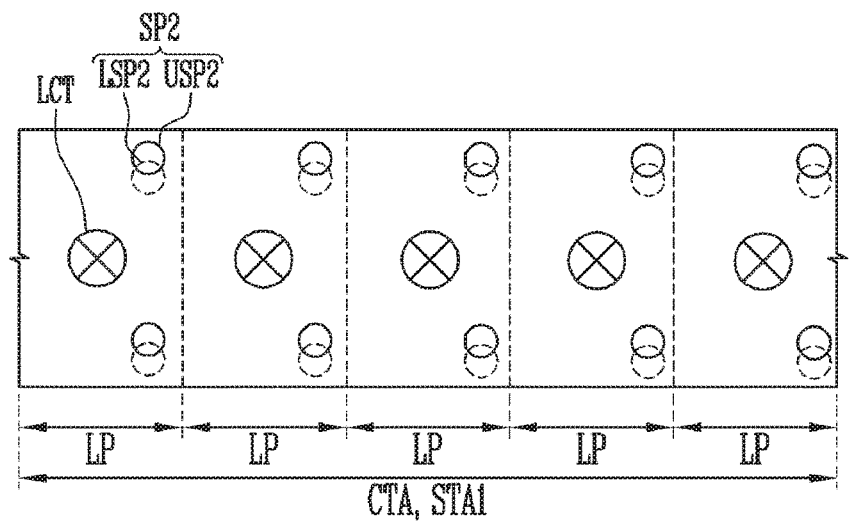
FIGS. 6A to 6C are diagrams illustrating various modifications of a second support, according to an embodiment of the present disclosure.
Figure 6B:
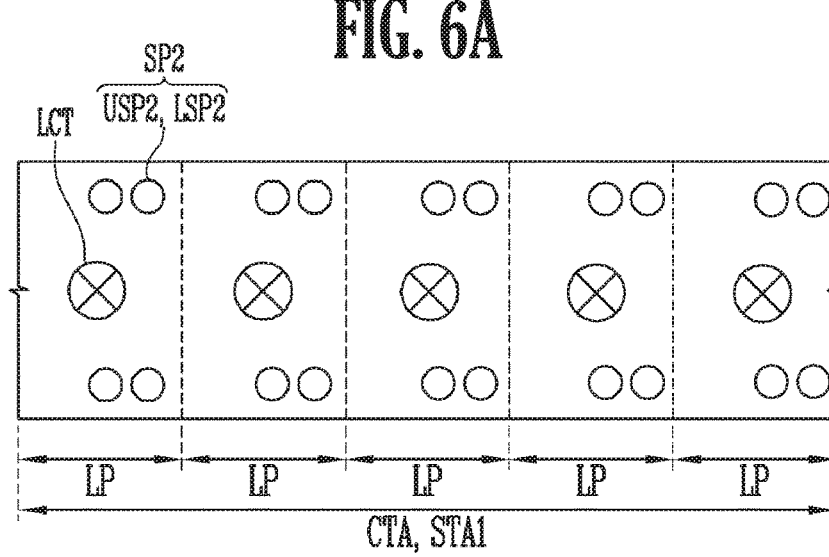
Figure 6C:
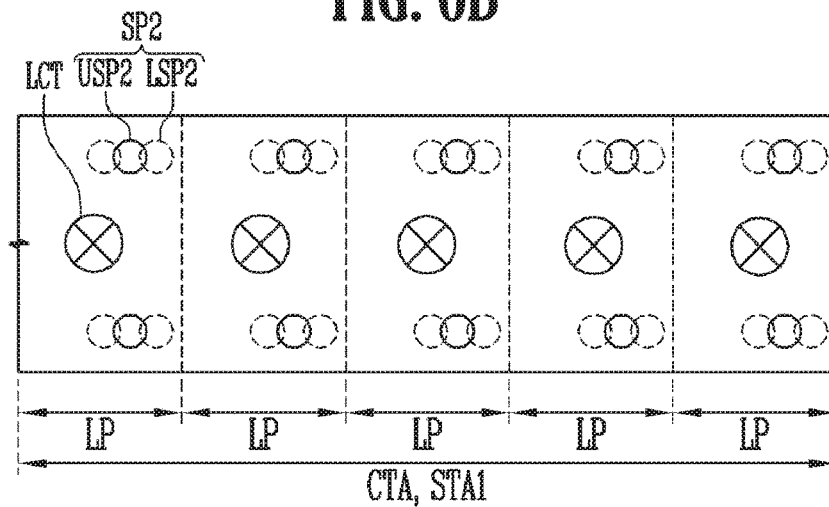

FIGS. 6A to 6C are diagrams illustrating various variations of the second support SP2, according to an embodiments of the present disclosure.

Each of the first stepped structures STA1 of the contact region CTA as shown in FIGS. 1A to 1C may be replaced by one of the first stepped structures STA1 of the contact region CTA as shown in FIGS. 6A to 6C. Each of the second supports SP2 may include a second upper pillar USP2 and one or more second lower pillars LSP2, as described above with reference to FIG. 2A.

Referring to FIGS. 6A to 6C, the layout of the second supports SP2 may vary in comparison with the embodiments shown in FIGS. 1A to 1C. The second supports SP2 may be arranged so as not to reach the second contact plugs LCT.

The second lower pillars LSP2 of the second supports SP2 may pass through the lower pad portions LP as described above with reference to FIG. 2A. In a horizontal view, the second lower pillars LSP2 may be disposed adjacent to corners of the lower pad portions LP with each of the second lower pillars LSP2 disposed at each of the corners of each of the lower pad portions LP as shown in FIGS. 1A to 1C and 6A. Alternatively, in a horizontal view, the second lower pillars LSP2 may be disposed adjacent to the corners of the lower pad portions LP with two second lower pillars LSP2 disposed at each of the corners of each of the lower pad portions LP as shown in FIGS. 6B and 6C.

The second upper pillars USP2 of the second supports SP2 may pass through the insulating layer L2 of FIG. 2A disposed on the first stepped structure STA1 as shown in FIG. 2A. Central axes of the second upper pillars USP2 may coincide with those of the second lower pillars LSP2, respectively, as shown in FIGS. 1A to 1C and 6B. In another example, the central axes of the second upper pillars USP2 might not be aligned with those of the second lower pillars LSP2, as shown in FIGS. 6A and 6C.

Each of the second supports SP2 may include one second upper pillar USP2 and one second lower pillar LSP2 overlapping each other as shown in FIGS. 1A to 1C and 6A and 6B. In other words, each of the second supports SP2 may include a single second upper pillar USP2 and a single second lower pillar LSP2 extending from the second upper pillar USP2.

In another example, each of the second supports SP2 may include one second upper pillar USP2 and two second lower pillars LSP2 overlapping the second upper pillar USP2. In other words, each of the second supports SP2 may include two different second lower pillars LSP2 extending from a single second upper pillar USP2.

FIGS. 7A to 7F are diagrams illustrating various variations for the second upper and lower pillars of the second supports SP2, according to different embodiments of the present disclosure.

Figure 7A:
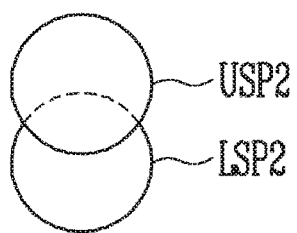
FIGS. 7A to 7F are diagrams illustrating various modifications of second upper and lower pillars of a second support, according to an embodiment of the present disclosure.
Figure 7B:
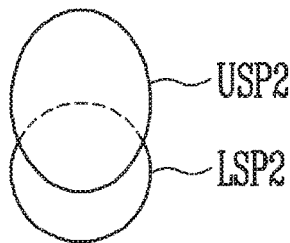
Figure 7C:
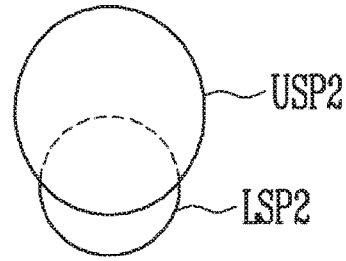
Figure 7D:
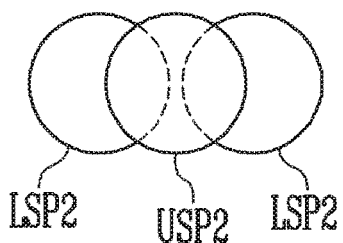

Referring to FIGS. 7A and 7D, the second lower pillar LSP2 and the second upper pillar USP2 may have the same cross-sectional shape and area.

Referring to FIGS. 7B, 7C, 7E, and 7F, the second upper pillar USP2 and each of the second lower pillars LSP2 may have different cross-sectional shapes and areas from each other.

Figure 7E:
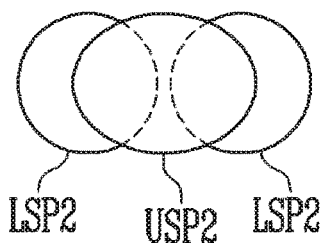

For example, the second upper pillar USP2 may have an elliptical cross section, as shown in FIGS. 7B and 7E, and each of the second lower pillars LSP2 may have a circular cross section.

Figure 7F:
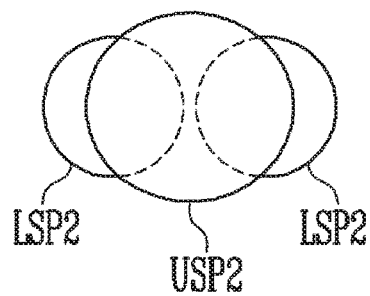

In another example, the second upper pillar USP2 and each of the second lower pillars LSP2 may have circular cross sections as shown in FIGS. 7C and 7F, and the second upper pillar USP2 may have a greater cross-sectional area than each of the second lower pillars LSP2.

However, the cross-sectional shapes of each of the second lower pillars LSP2 and the second upper pillar USP2 are not limited to the above-described circular or elliptical shape. For example, each of the second lower pillars LSP2 and/or the second upper pillar USP2 may have various polygonal shapes, such as a triangle or a square.

Figure 8A:
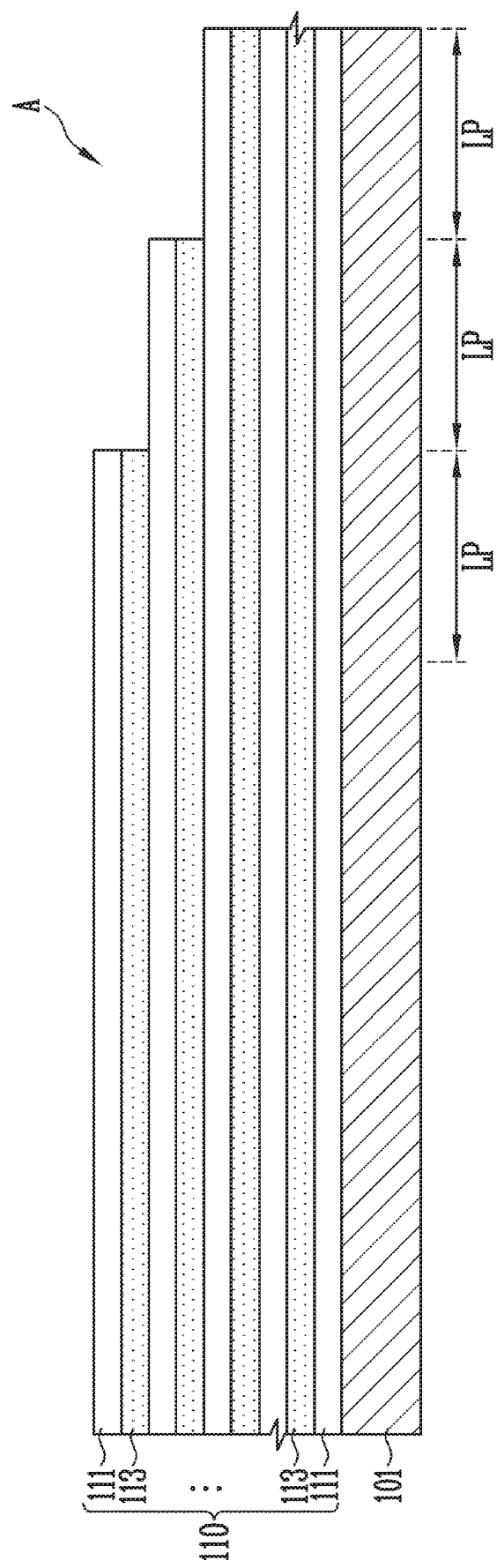
Figure 8B:
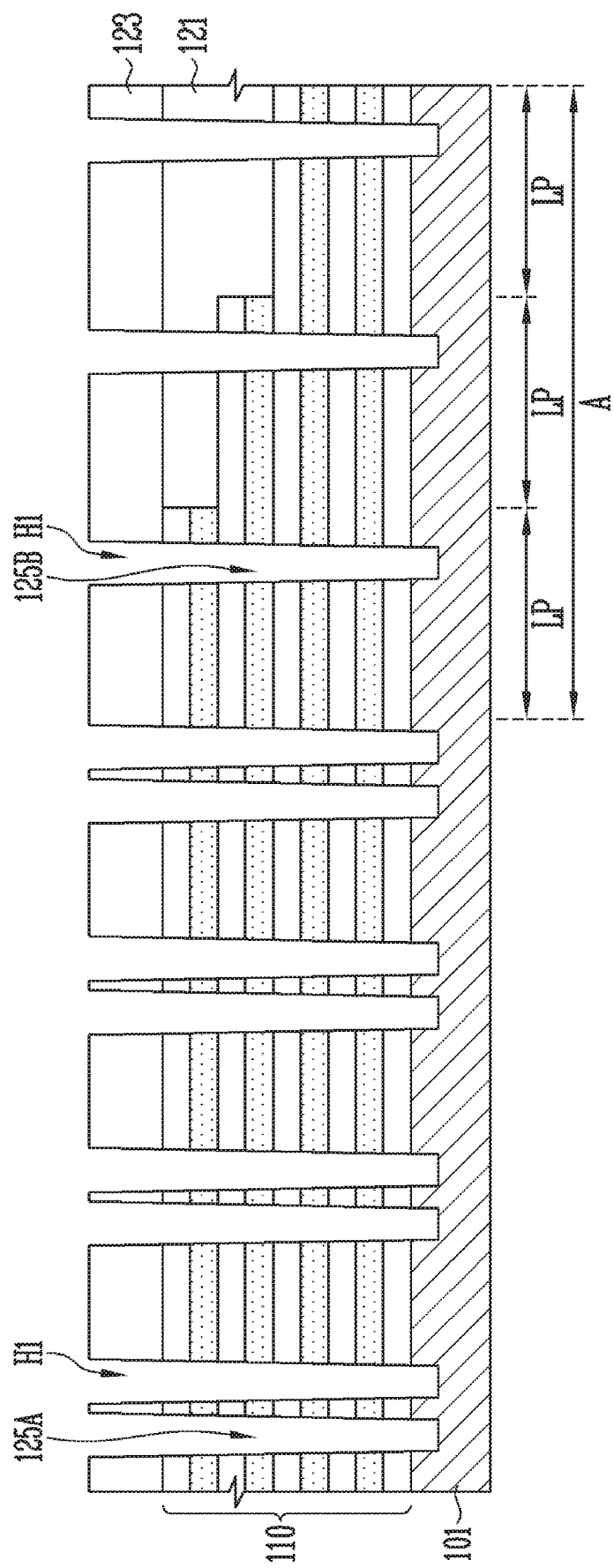
Figure 8C:
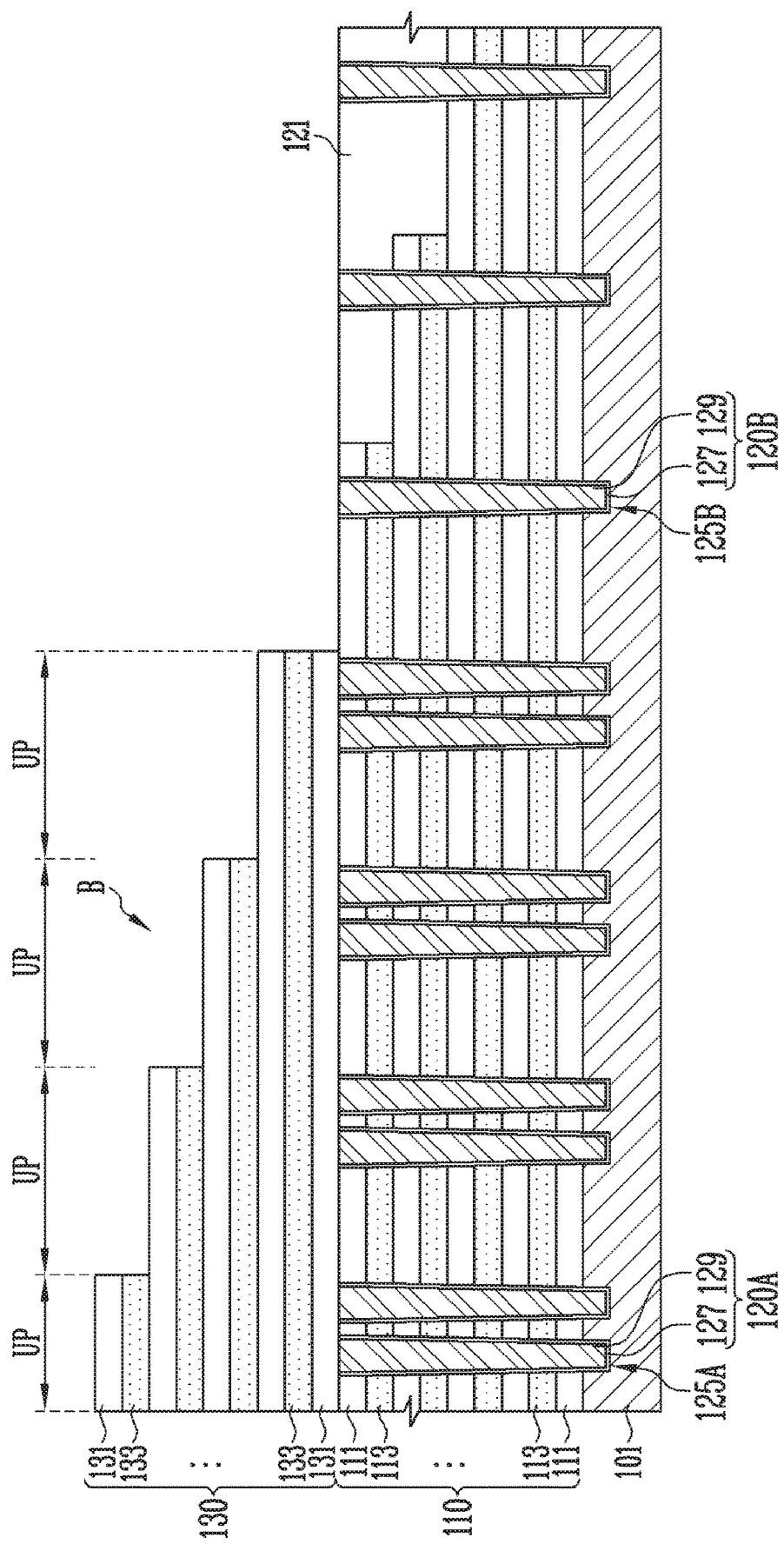
Figure 8D:
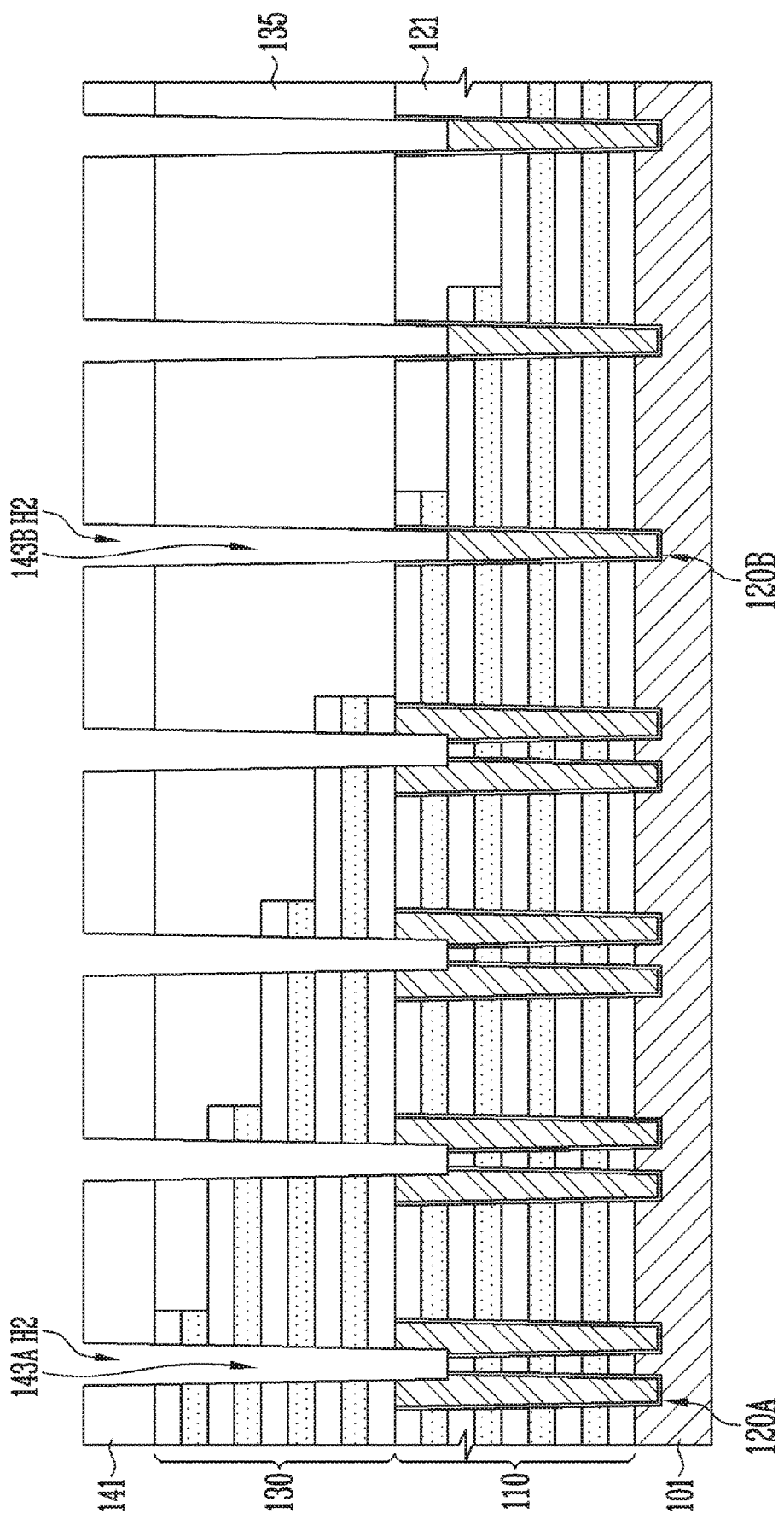
Figure 8F:
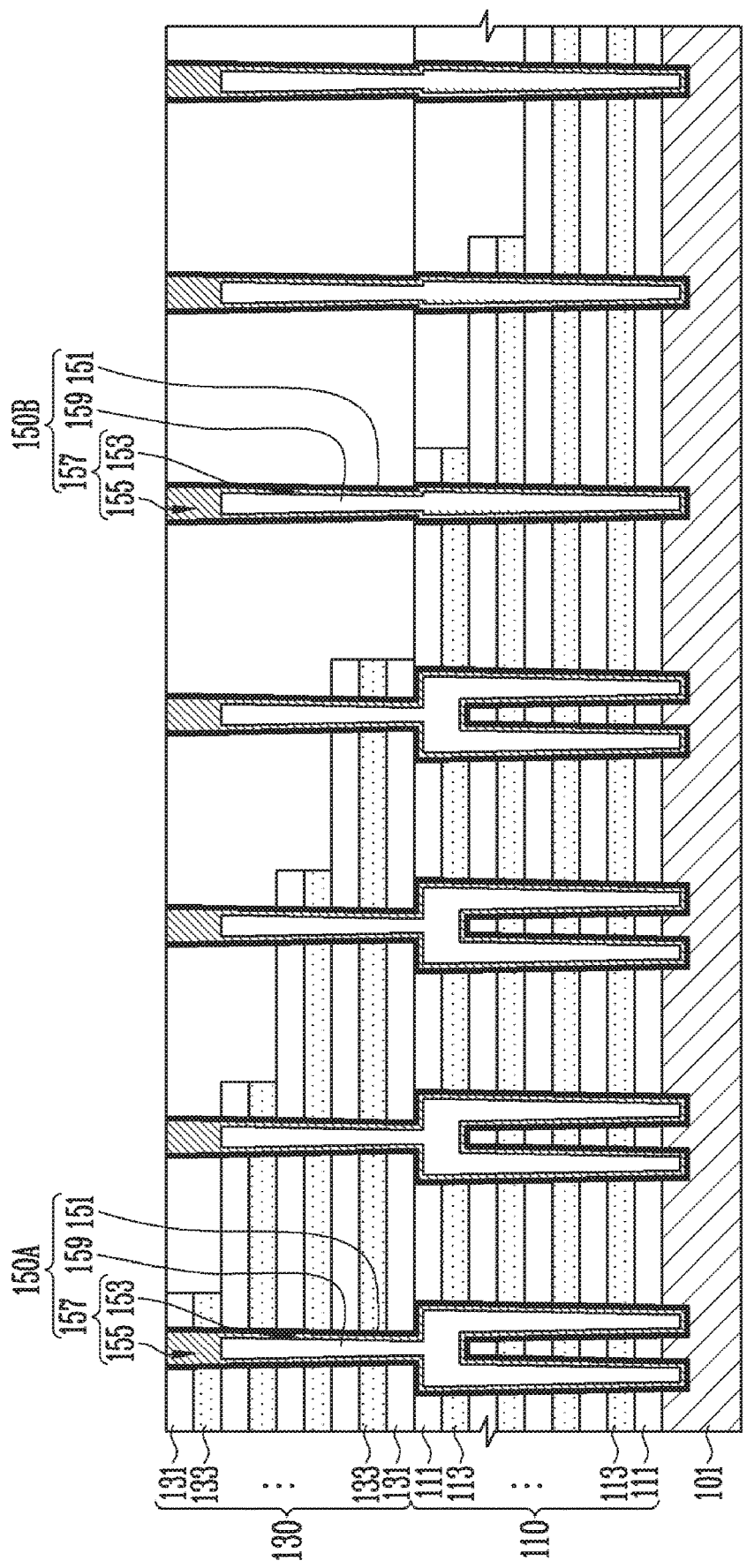
Figure 9A:
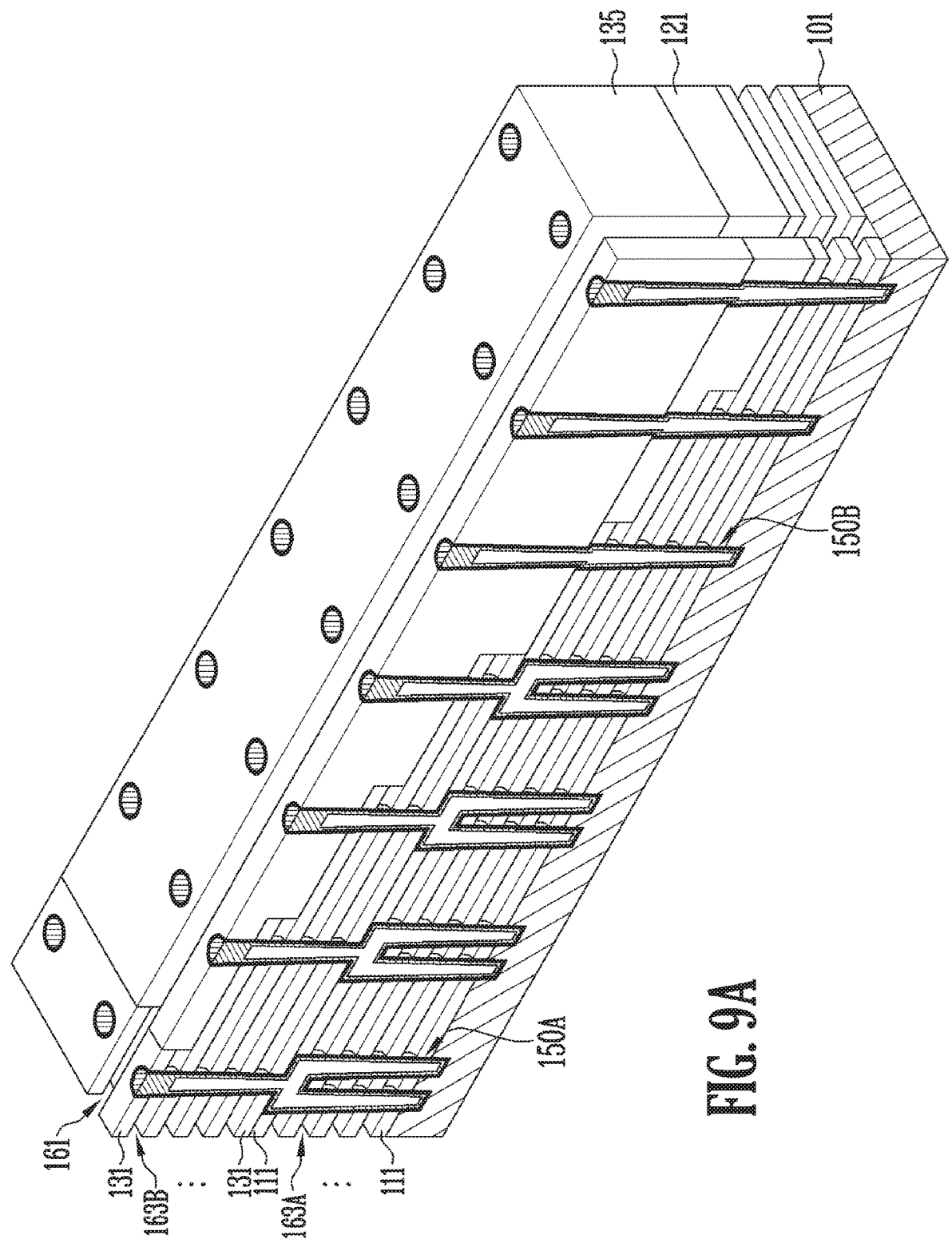
Figure 9B:
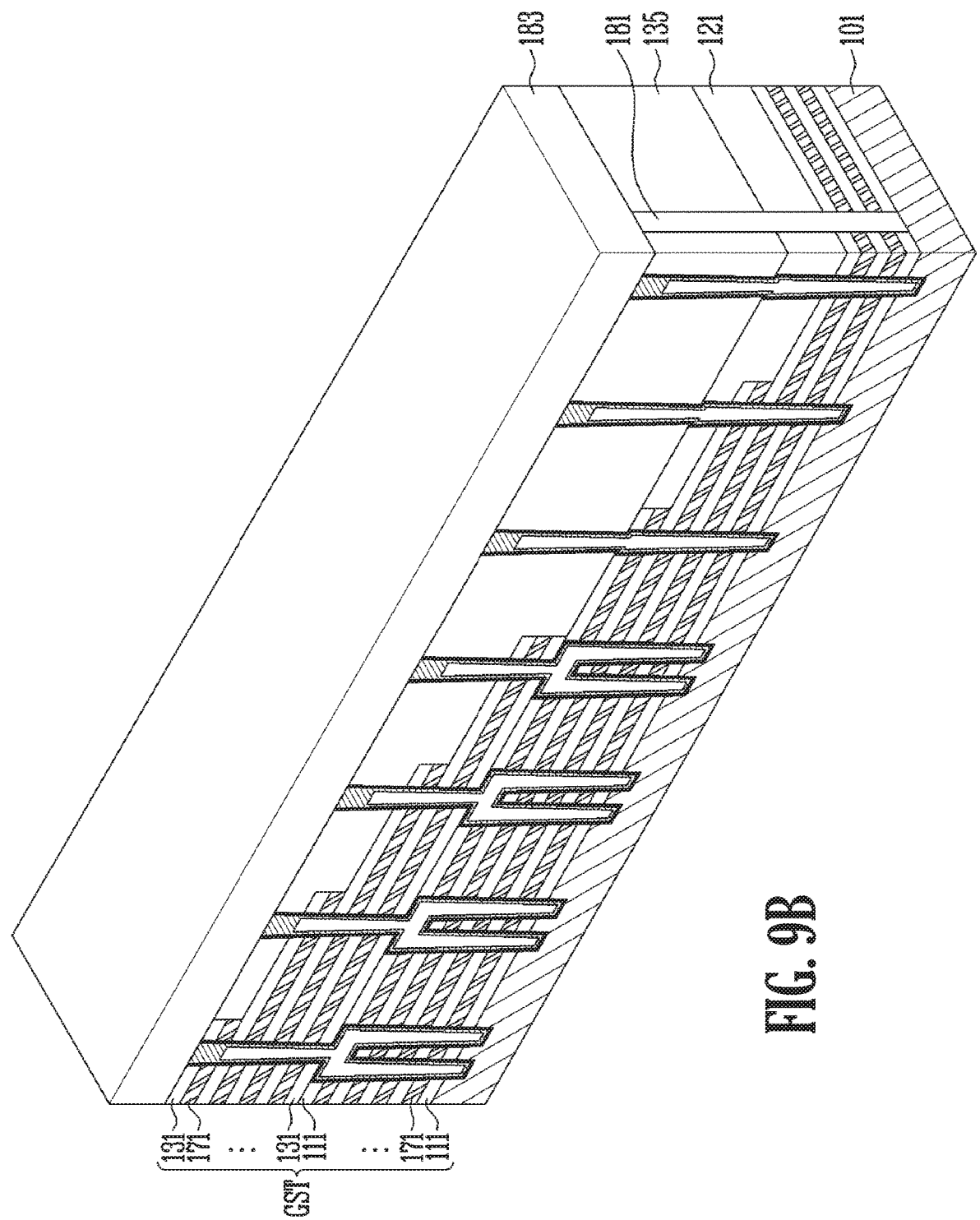

FIGS. 8A to 8F and FIGS. 9A and 9B are diagrams sequentially illustrating a method of manufacturing a semiconductor device according to an embodiment of the present disclosure. FIGS. 8A to 8F are cross-sectional diagram illustrating sequential processes taken along line I-I' of FIG. 1A. FIGS. 9A and 9B are perspective views schematically showing some of the subsequent processes to the process of forming first and second supports. A method of manufacturing a semiconductor device as described with reference to FIGS. 8A to 8F and FIGS. 9A and 9B may be applicable to forming the semiconductor device as described above with reference to FIGS. 1A to 1C, 5A to 5I, 6A to 6C, and 7A to 7F.

Referring to FIG. 8A, a first stacked structure 110 having a first stepped structure A may be formed on a semiconductor layer 101.

The semiconductor layer 101 may be a bulk silicon substrate, a silicon-on-insulator substrate, a germanium on substrate, a germanium-on-insulator substrate, a silicon-germanium substrate, or an epitaxial thin film formed by a selective epitaxial growth method. Alternatively, the semiconductor layer 101 may include a doped layer which serves as a source layer, or a pipe gate. The doped layer may be a doped silicon layer.

Forming the first stacked structure 110 having the first stepped structure A may include alternately stacking first material layers 111 and second material layers 113 on the semiconductor layer 101 and patterning the first material layers 111 and the second material layers 113 in a stepped structure. One of the first material layers 111 may be the uppermost layer of the first stacked structure 110 and another first material layer 111 may be the lowermost layer of the first stacked structure 110.

The first material layers 111 and the second material layers 113 may include different materials. According to an embodiment, each of the first material layers 111 may include an insulating material for an interlayer insulating layer, and each of the second material layers 113 may include a sacrificial material having an etch selectivity with respect to each of the first material layers 111. More specifically, for example, each of the first material layers 111 may include an oxide layer, such as a silicon oxide layer (SiO$_2$), and each of the second material layers 113 may include a nitride layer, such as a silicon nitride layer (SiN). According to another embodiment, each of the second material layers 113 may include a conductive material for a conductive pattern, and each of the first material layers 111 may include a sacrificial material having an etch selectivity with respect to each of the second material layers 113. More specifically, for example, each of the first material layers 111 may include an undoped silicon layer, and each of the second material layers 113 may include a doped silicon layer or a metal layer.

By patterning the first material layers 111 and the second material layers 113, which are stacked in a vertical direction, edge portions of the second material layers 113 may define the first stepped structure A. The edge portions of the second material layers 113 forming the first stepped structure A may be defined as lower pad portions LP. The lower pad portions LP of the second material layers 113 may extend in a horizontal direction along the semiconductor layer 101 to define the first stepped structure A.

Referring to FIG. 8B, a first insulating layer 121 covering the first stepped structure A may be formed. The first insulating layer 121 may include an oxide layer. The surface of the first insulating layer 121 may be planarized. By the planarizing process, an upper surface of the first stacked structure 110 may be exposed. The surface of the first insulating layer 121 may be planarized by chemical mechanical polishing.

A mask pattern 123 may be formed on the first stacked structure 110. The mask pattern 123 may include a plurality of first holes H1. The layout of the first holes H1 may vary according to the design of first and second supports. For example, in a horizontal view, the layout of the first holes H1 may vary in accordance with a selected layout from among the various layouts of the first lower pillars LSP1 and the second lower pillars LSP2 as illustrated in FIGS. 1A to 1C, 5A to 5I, 6A to 6C, and 7A to 7F. The mask pattern 123 may include a photoresist pattern formed using a photolithography process.

The first stacked structure 110 may be etched by an etch process using the mask pattern 123 as an etch barrier. As a result, first lower holes 125A and second lower holes 125B, which pass through the first stacked structure 110 and expose the semiconductor layer 101, may be created.

The first lower holes 125A may pass through a portion of the first stacked structure 110 adjacent to the lower pad portions LP forming the first stepped structure A. The second lower holes 125B may pass through at least one of the lower pad portions LP forming the first stepped structure A. The second lower holes 125B may further pass through the first insulating layer 121 over the lower pad portions LP.

The mask pattern 123 may further include opening holes defining an area where the cell plug CPL as shown in FIG. 2C is disposed. The first lower holes 125A and the second lower holes 125B may be formed at the same time as cell through holes arranged in the cell region of the first stacked structure 110 are formed.

After the first lower holes 125A and the second lower holes 125B are formed, the mask pattern 123 may be removed.

Referring to FIG. 8C, each of the first and second lower holes 125A and 125B may be filled with sacrificial materials 127 and 129 having etch selectivities with respect to the first and second material layers 111 and 113, respectively. As a result, first sacrificial pillars 120A may be formed in the first lower holes 125A, and second sacrificial pillars 120B may be formed in the second lower holes 125B. The sacrificial materials 127 and 129 may have etch selectivities with respect to third and fourth material layers 131 and 133 to be formed in subsequent processes.

The sacrificial materials 127 and 129 may include metal, barrier metal, or polysilicon. The sacrificial materials 127 and 129 may include a single material or different types of materials. For example, the sacrificial materials may include a barrier metal layer 127 and a metal layer 129. The barrier metal layer 127 may be conformally deposited on a surface of each of the first and second lower holes 125A and 125B. The metal layer 129 may be formed on the barrier metal layer 127 and completely fill each of the first and second lower holes 125A and 125B. A titanium nitride layer (TiN) may be used as the barrier metal layer 127, and tungsten (W) may be used as the metal layer 129.

A second stacked structure 130 having a second stepped structure B may be formed on the first stacked structure 110 penetrated by the first sacrificial pillars 120A and the second sacrificial pillars 120B.

Forming the second stacked structure 130 having the second stepped structure B may include alternately stacking the third material layers 131 and the fourth material layers 133 on the first stacked structure 110 and patterning the third material layers 131 and the fourth material layers 133 in a stepped structure. One of the third material layers 131 may form the uppermost layer of the second stacked structure 130 and another third material layer 131 may form the lowermost layer of the second stacked structure 130. The third material layers 131 may include the same material as the first material layers 111, and the fourth material layers 133 may include the same material as the second material layers 113.

The third material layers 131 and the fourth material layers 133, which are stacked in a vertical direction, may be patterned stepwise, so that edge portions of the fourth material layers 133 may define the second stepped structure B. The edge portions of the fourth material layers 133 forming the second stepped structure B may be defined by the upper pad portions UP. The upper pad portions UP of the fourth material layers 133 may extend in a horizontal direction parallel to the semiconductor layer 101 to define the second stepped structure B.

The second stacked structure 130 having the second stepped structure B may extend to cover the first sacrificial pillars 120A and may be patterned to expose the second sacrificial pillars 120B.

Referring to FIG. 8D, a second insulating layer 135 covering the first insulating layer 121 and the second stepped structure B may be formed. The second insulating layer 135 may include an oxide layer. The surface of the second insulating layer 135 may be planarized. By the planarizing process, an upper surface of the second stacked structure 130 may be exposed. The surface of the second insulating layer 135 may be planarized by chemical mechanical polishing.

A mask pattern 141 may be formed over the second stacked structure 130. The mask pattern 141 may include a plurality of second holes H2. The layout of the second holes H2 may vary according to the design of the first and second supports. For example, in a horizontal view, the layout of the second holes H2 may vary in accordance with a selected layout from among the various layouts of the first upper pillars USP1 and the second upper pillars USP2, as illustrated in FIGS. 1A to 1C, 5A to 5I, 6A to 6C, and 7A to 7F. The mask pattern 141 may include a photoresist pattern formed using a photolithography process.

The second stacked structure 130 may be etched by an etch process using the mask pattern 141 as an etch barrier. As a result, first upper holes 143A passing through the second stepped structure B of the second stacked structure 130 and second upper holes 143B passing through the second insulating layer 135, as shown in FIG. 8D, may be formed. Each of the first upper holes 143A may overlap two or more of the first sacrificial pillars 120A. Each of the second upper holes 143B may overlap one or more of the second sacrificial pillars 120B. The overlapping structure of the first upper holes 143A and the first sacrificial pillars 120A may vary according to the design of the first supports. The overlapping structure of the second upper holes 143B and the second sacrificial pillars 120B may vary according to the design of the second supports.

The mask pattern 141 may further include opening holes defining an area where the cell plugs CPL as shown in FIG. 2C are arranged. The first upper holes 143A and the second upper holes 143B may be formed at the same time as cell through holes arranged in the cell region of the second stacked structure 130 are formed.

According to an embodiment of the present disclosure, each of the first sacrificial pillars 120A may be exposed through at least one of the first upper holes 143A, and each of the second sacrificial pillars 120B may be exposed through at least one of the second upper holes 143B. As a result, the first sacrificial pillars 120A and the second sacrificial pillars 120B may be completely removed through the first upper holes 143A and the second upper holes 143B, respectively. Therefore, an operational failure of the semiconductor device caused by remaining first and second sacrificial pillars 120A and 120B including conductive material may be prevented. For example, when the first sacrificial pillars 120A and the second sacrificial pillars 120B remain, the conductive patterns CP1 and CP2 stacked in a vertical direction as shown in FIG. 2A may be electrically coupled by the first and second sacrificial pillars 120A and 120B. However, this failure may be prevented according to embodiments of the present disclosure.

Referring to FIG. 8E, the first sacrificial pillars 120A and the second sacrificial pillars 120B as shown in FIG. 8D may be removed through the first upper holes 143A and the second upper holes 143B, respectively, so that the first lower holes 125A and the second lower holes 125B may be opened.

The structure where each of the first upper holes 143A is coupled to at least two of the first lower holes 125A may be defined as a first opening OP1, and the structure where each of the second upper holes 143B is coupled to at least one of the second lower holes 125B may be defined as a second opening OP2. After the first opening OP1 and the second opening OP2 are formed, the mask pattern 141 as described above with reference to FIG. 8D may be removed.

Referring to FIG. 8F, a first support 150A and a second support 150B may be formed in the first opening OP1 and the second opening OP2, respectively, as shown in FIG. 8E.

Each of the first and second supports 150A and 150B may include a memory layer 151, a semiconductor layer 157, and a gap-filling insulating layer 159. As described above with reference to FIG. 3, the memory layer 151 may include a blocking insulating layer, a data storage layer, and a tunnel insulating layer. The memory layer 151 may be conformally formed along a surface of each of the first and second openings OP1 and OP2 as shown in FIG. 8E. The semiconductor layer 157 may be divided into a first portion 153 and a second portion 155. The first portion 153 may be disposed between the memory layer 151 and the gap-filling insulating layer 159, and the second portion 155 may fill a central area of an upper portion of the memory layer 151 protruding above the gap-filling insulating layer 159. The second portion 155 may be a region doped with impurities. However, the gap-filling insulating layer 159 might not be formed. When the gap-filling insulating layer 159 is not formed, the central area of the memory layer 151 may be completely filled with the semiconductor layer 157.

In another embodiment different from the embodiment shown in FIG. 8E, the first support 150A and the second support 150B may be formed by completely filling the first opening OP1 and the second opening OP2, respectively, as shown in FIG. 8E with an insulating material.

Referring to FIG. 9A, a slit 161 may pass through the first stacked structure 110 and the second stacked structure 130, as shown in FIG. 8F. The slit 161 may extend to pass through the first insulating layer 121 and the second insulating layer 135. The semiconductor layer 101 may be exposed through the slit 161.

The sacrificial material layers of the first stacked structure 110 and the second stacked structure 130 as shown in FIG. 8F may be selectively removed through the slit 161. For example, the second material layers 113 of the first stacked structure 110 and the fourth material layers 133 of the second stacked structure 130 may be selectively removed through the slit 161. As a result, first horizontal spaces 163A may be opened between the first material layers 111 adjacent to each other in the vertical direction, and second horizontal spaces 163B may be opened between the third material layers 131 adjacent to each other in the vertical direction.

According to the above described embodiments of the present teachings, a bending phenomenon of each of the first material layers 111 and the third material layers 131 may be prevented by the first support 150A and the second support 150B, respectively. As a result, gaps of the first and second horizontal spaces 163A and the 163B may be maintained. In particular, according to an embodiment of the present disclosure, a lower structure of the first support 150A may be designed to support load while firmly maintaining the gaps of the first horizontal spaces 163A.

Referring to FIG. 9B, each of the first horizontal spaces 163A and the second horizontal spaces 163B as shown in FIG. 9A may be filled with a conductive pattern 171.

Forming the conductive pattern 171 may include filling the first and second horizontal spaces 163A and 163B as shown in FIG. 9A with a conductive material, and removing a portion of the conductive material in the slit 161 as shown in FIG. 9A so as to define the conductive pattern 171.

The conductive pattern 171 may include at least one of a doped silicon layer, a metal silicide layer, and a metal layer. The conductive pattern 171 may include low-resistance metal such as tungsten for low-resistance lines. The conductive pattern 171 may further include a barrier layer, such as a titanium nitride layer, a tungsten nitride layer, or a tantalum nitride layer.

The first material layers 111 and the third material layers 131 may remain as interlayer insulating layers. The first material layers 111 and the third material layers 131 remaining as the interlayer insulating layers, and the conductive pattern 171 may constitute the gate stacked structure GST.

After a vertical structure 181 filling the slit 161 as shown in FIG. 9A is formed, a third insulating layer 183 may be formed. The vertical structure 181 may include an insulating material. The vertical structure 181 may further include an insulating material and a conductive layer passing through the insulating material.

Various subsequent processes may be further performed to form a bit line, a metal line, and contact plugs.

In another embodiment different from the embodiment described above with reference to FIGS. 9A and 9B, the first material layers 111 and the third material layers 131 may be replaced by an insulating material configured as interlayer insulating layers through the slit. Furthermore, the second material layers 113 and fourth material layers 133 may remain as conductive patterns. As a result, the gate stacked structure may be formed.

According to the above-described embodiments of the present disclosure, by designing the structure of the supports passing through the first and second stacked structures so as to improve a supporting force, structural stability of the semiconductor device may be increased.

Figure 10:
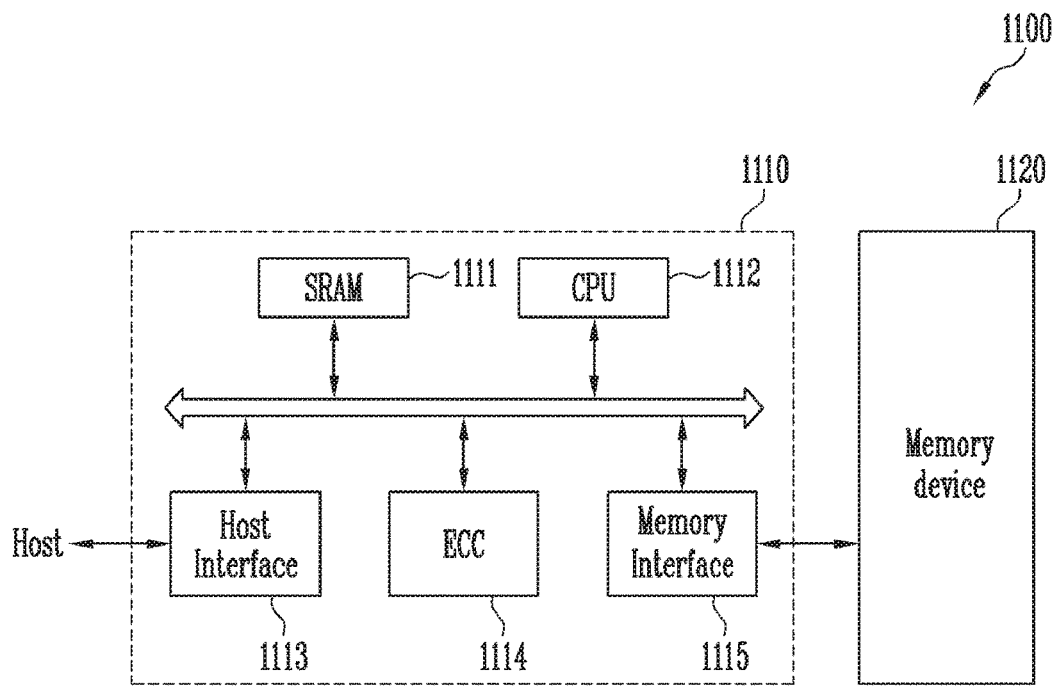
FIG. 10 is a block diagram illustrating a configuration of a memory system, according to an embodiment of the present disclosure.

FIG. 10 is a block diagram illustrating the configuration of a memory system 1100 according to an embodiment of the present disclosure.

Referring to FIG. 10, the memory system 1100 according to the embodiment of the present disclosure may include a memory device 1120 and a memory controller 1110.

The memory device 1120 may be a multi-chip package including a plurality of flash memory chips. The memory device 1120 may include a stacked structure supported by a support including at least two lower pillars extending from one upper pillar.

The memory controller 1110 may be configured to control the memory device 1120 and include a static random access memory (SRAM) 1111, a CPU 1112, a host interface 1113, an error correction code (ECC) 1114, and a memory interface 1115. The SRAM 1111 may serve as an operation memory of the CPU 1112, the CPU 1112 may perform a control operation for data exchange of the memory controller 1110, and the host interface 1113 may include a data exchange protocol of a host accessing the memory system 1100. In addition, the ECC 1114 may detect and correct errors included in the data read from the memory device 1120, and the memory interface 1115 may perform interfacing with the memory device 1120. In addition, the memory controller 1110 may further include a read only memory (ROM) for storing code data for interfacing with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer Small Interface (SCSI), Enhanced Small Disk Interface (ESDI), and Integrated Drive Electronics (IDE).

Figure 11:
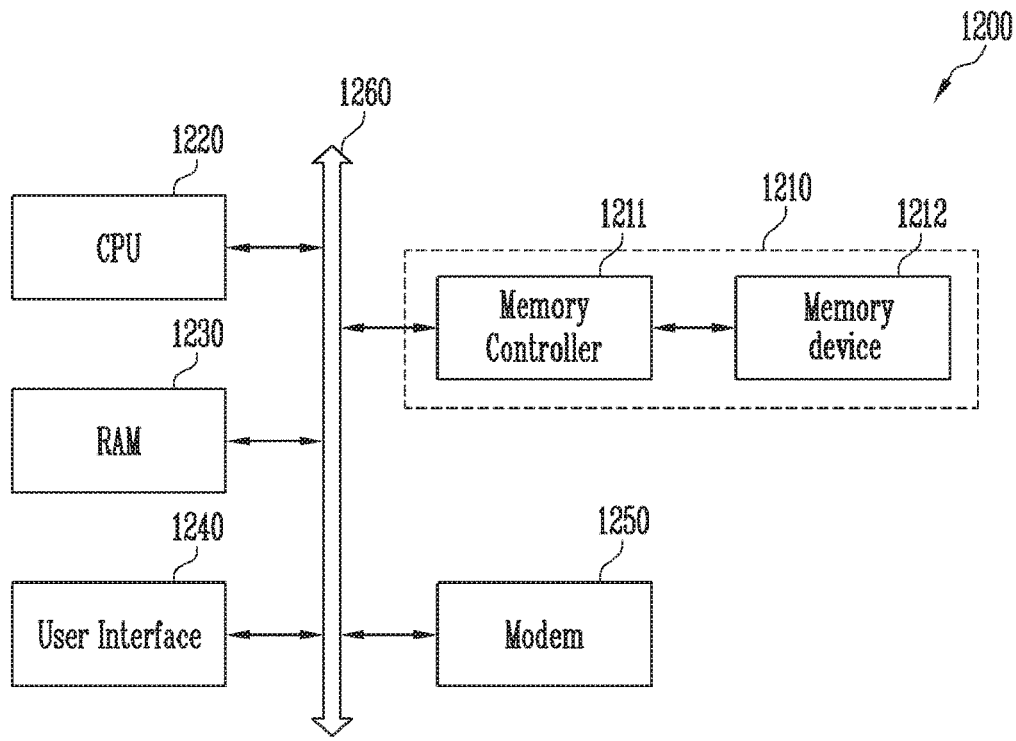
FIG. 11 is a block diagram illustrating a configuration of a computing system, according to an embodiment of the present disclosure.

FIG. 11 is a block diagram illustrating the configuration of a computing system 1200 according to an embodiment of the present disclosure.

Referring to FIG. 11, the computing system 1200 in accordance with an embodiment of the present disclosure may include a CPU 1220, a random access memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, and an application chipset, a camera image processor (CIS), a mobile deem, and the like may be further included.

The memory system 1210 may include a memory device 1212 and a memory controller 1211.

The embodiments disclosed in the present specification and the drawings aim to help those with ordinary knowledge in this art more clearly understand the present disclosure rather than aiming to limit the metes bounds of the present disclosure. It should be understood that many variations and modifications of the basic inventive concept described herein will still fall within the spirit and scope of the present disclosure as defined in the accompanying claims and equivalents thereof.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings. So far as not being clearly defined in this application, terms should not be understood in an ideally or excessively formal way.

What is claimed is:

1. A method of manufacturing a semiconductor device, the method comprising:
    forming a first stacked structure;
    forming first sacrificial pillars and second sacrificial pillars passing through the first stacked structure;
    forming a second stacked structure on the first stacked structure, the second stacked structure extending to cover the first sacrificial pillars and exposing the second sacrificial pillars;
    forming first upper holes passing through the second stacked structure, wherein each of the first upper holes overlaps at least two of the first sacrificial pillars adjacent to each other in a direction parallel to an interface between the first stacked structure and the second stacked structure;
    removing the first sacrificial pillars through the first upper holes to open first lower holes; and
    forming first supports in the first upper holes and the first lower holes.

2. The method of claim 1, wherein the first stacked structure includes first material layers and second material layers stacked alternately with each other, and the second material layers include lower pad portions stacked in a first stepped structure, and
    wherein the second stacked structure includes third material layers and fourth material layers stacked alternately with each other, and the fourth material layers include upper pad portions stacked in a second stepped structure.

3. The method of claim 2, wherein the forming of the first sacrificial pillars and the second sacrificial pillars comprises:
    forming a first insulating layer covering the first stepped structure of the first stacked structure;
    forming the first lower holes passing through a portion of the first stacked structure adjacent to the first stepped structure and second lower holes passing through the first stepped structure; and
    filling the first lower holes and the second lower holes with a sacrificial material having an etch selectivity with respect to the first, second, third, and fourth material layers.

4. The method of claim 3, further comprising:
    forming a second insulating layer covering the first insulating layer and the second stepped structure of the second stacked structure;
    forming second upper holes passing through the second insulating layer to overlap the second sacrificial pillars;
    removing the second sacrificial pillars through the second upper holes to open the second lower holes; and
    forming second supports in the second upper holes and the second lower holes,
    wherein each of the second supports fills each of the second upper holes and at least one of the second lower holes overlapping each of the second upper holes.

5. The method of claim 3, wherein the first upper holes pass through the second stepped structure.

6. The method of claim 5, wherein each of the first upper holes passes through a different upper pad portion of the second stepped structure.

7. A method of manufacturing a semiconductor device, the method comprising:
    forming a first stacked structure;
    forming first sacrificial pillars and second sacrificial pillars passing through the first stacked structure;
    forming a second stacked structure on the first stacked structure, the second stacked structure extending to cover the first sacrificial pillars and exposing the second sacrificial pillars;
    forming first upper holes passing through the second stacked structure, the first upper holes each overlapping at least two of the first sacrificial pillars;
    removing the first sacrificial pillars through the first upper holes to open first lower holes; and
    forming first supports in the first upper holes and the first lower holes, wherein each of the first supports fills a connection structure between each of the first upper holes and two to four different first lower holes overlapping each of the first upper holes.

* * * * *